United States Patent
Izumida et al.

(10) Patent No.: US 9,018,682 B2
(45) Date of Patent: Apr. 28, 2015

(54) SEMICONDUCTOR MEMORY DEVICE

(71) Applicant: Kabushiki Kaisha Toshiba, Minato-ku (JP)

(72) Inventors: Takashi Izumida, Kanagawa-ken (JP); Tsukasa Nakai, Mie-ken (JP); Masaki Kondo, Mie-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/143,077

(22) Filed: Dec. 30, 2013

(65) Prior Publication Data

US 2014/0367758 A1    Dec. 18, 2014

(30) Foreign Application Priority Data

Jun. 12, 2013   (JP) ................... 2013-123580

(51) Int. Cl.
    *H01L 27/148*    (2006.01)
    *H01L 27/105*    (2006.01)

(52) U.S. Cl.
    CPC ................. *H01L 27/1052* (2013.01)

(58) Field of Classification Search
    CPC ............ H01L 27/11578; H01L 29/7926
    USPC ............ 257/324, 306, 390, 316, 314
    See application file for complete search history.

(56) References Cited

U.S. PATENT DOCUMENTS

| | | | | |
|---|---|---|---|---|
| 6,083,845 | A * | 7/2000 | Yang et al. | 438/734 |
| 7,936,004 | B2 | 5/2011 | Kito et al. | |
| 8,030,700 | B2 * | 10/2011 | Sakamoto | 257/324 |
| 8,551,838 | B2 | 10/2013 | Kito et al. | |
| 2009/0321813 | A1 * | 12/2009 | Kidoh et al. | 257/324 |
| 2011/0018052 | A1 | 1/2011 | Fujiwara et al. | |
| 2011/0156132 | A1 | 6/2011 | Kiyotoshi | |
| 2011/0284947 | A1 | 11/2011 | Kito et al. | |
| 2011/0294276 | A1 * | 12/2011 | Kuroki | 438/381 |
| 2012/0068241 | A1 * | 3/2012 | Sakuma et al. | 257/314 |
| 2012/0175734 | A1 * | 7/2012 | Sohn | 257/532 |
| 2013/0164922 | A1 * | 6/2013 | Cho et al. | 438/510 |

OTHER PUBLICATIONS

C. T. Black "Polymer self assembly in semiconductor microelectronics" IBM J. Res. & Dev. vol. 51 No. Sep. 5, 2007, p. 605-633.*

* cited by examiner

*Primary Examiner* — Kyoung Lee
*Assistant Examiner* — Chi-Hua Yang
(74) *Attorney, Agent, or Firm* — Oblon, McClelland, Maier & Neustadt, L.L.P.

(57) ABSTRACT

According to one embodiment, a semiconductor memory device includes a stacked body including a plurality of electrode layers stacked alternately with a plurality of insulating layers on the substrate, a channel body provided inside a hole piercing the stacked body, and a memory portion provided between the channel body and each of the plurality of electrode layers. The hole has a large diameter portion and a small diameter portion. The diameter of the hole is smaller at the small diameter portion than at the large diameter portion. A thickness of the electrode layer adjacent to the small diameter portion is thicker than a thickness of the electrode layer adjacent to the large diameter portion.

20 Claims, 12 Drawing Sheets

SEMICONDUCTOR MEMORY DEVICE

CROSS-REFERENCE TO RELATED APPLICATION

This application is based upon and claims the benefit of priority from Japanese Patent Application No. 2013-123580, filed on Jun. 12, 2013; the entire contents of which are incorporated herein by reference.

FIELD

Embodiments described herein relate generally to a semiconductor memory device.

BACKGROUND

A memory device having a three-dimensional structure has been proposed in which memory holes are made in a stacked body in which inter-electrode layer insulating layers are multiply stacked alternately with electrode layers that function as control gates of memory cells, and silicon bodies used to form channels are provided on the side walls of the memory holes with a charge storage film interposed between the silicon bodies and the side walls.

Although anisotropic etching such as, for example, RIE (Reactive Ion Etching), etc., is used to make the holes, the diameters of the holes may fluctuate in the depth direction. In particular, it becomes difficult to make a hole with a uniform diameter when the number of layers of the electrode layers is increased and the aspect ratio of the hole is high. The fluctuation in the depth direction of the diameters of the holes may cause fluctuation of the characteristics of the memory cell transistors.

DETAILED DESCRIPTION

Figure 1:
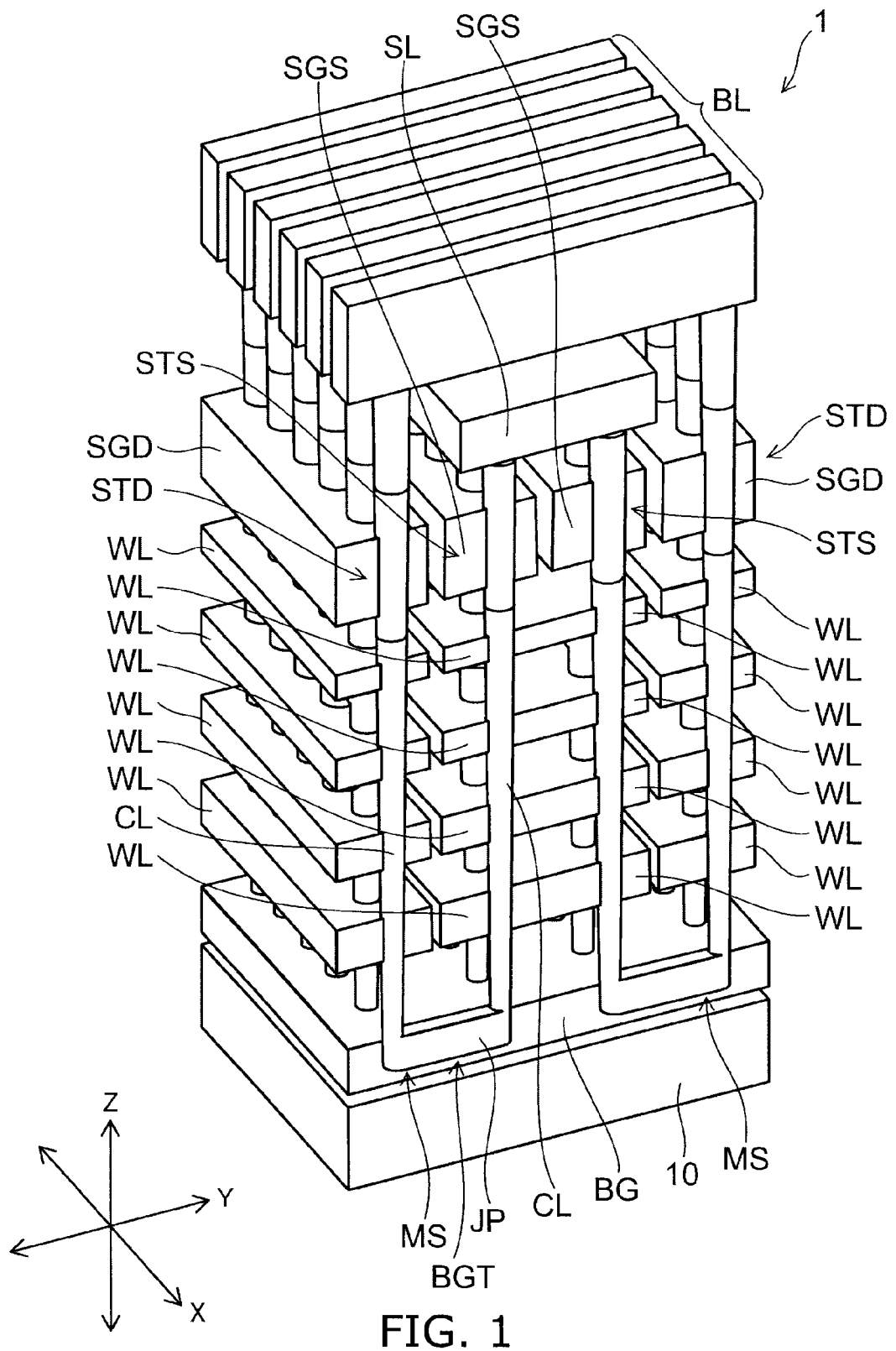
FIG. 1 is a schematic perspective view of a semiconductor memory device of the embodiment.

According to one embodiment, a semiconductor memory device includes a substrate; a stacked body including a plurality of electrode layers stacked alternately with a plurality of insulating layers on the substrate; a channel body provided inside a hole piercing the stacked body, the channel body extending in a stacking direction of the stacked body; and a memory portion provided between the channel body and each of the plurality of electrode layers. The hole has a large diameter portion and a small diameter portion. The diameter of the hole is smaller at the small diameter portion than at the large diameter portion. A thickness of the electrode layer adjacent to the small diameter portion is thicker than a thickness of the electrode layer adjacent to the large diameter portion.

Embodiments will now be described with reference to the drawings. Similar components in the drawings are marked with like reference numerals.

FIG. 1 is a schematic perspective view of a memory cell array 1 of a semiconductor memory device of an embodiment. For easier viewing of the drawing in FIG. 1, the insulating layers between electrode layers WL, etc., are not shown.

Two mutually orthogonal directions parallel to a major surface of a substrate 10 are taken as a Y-direction (a first direction) and an X-direction (a second direction); and a direction orthogonal to both the Y-direction and the X-direction is taken as a Z-direction (a third direction or a stacking direction).

Figure 2:
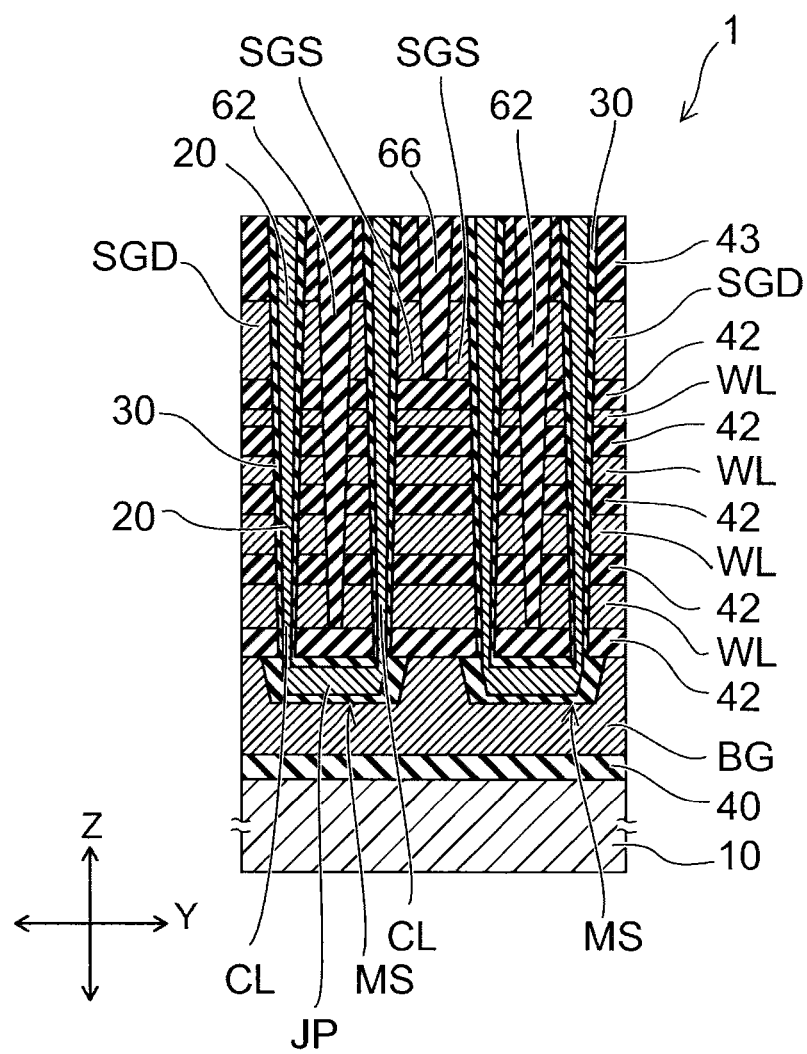
FIG. 2 is a schematic cross-sectional view of the semiconductor memory device of the embodiment.

FIG. 2 is a schematic cross-sectional view of the memory cell array 1 of the embodiment. FIG. 2 shows a cross section parallel to the YZ plane of FIG. 1.

Figure 3:
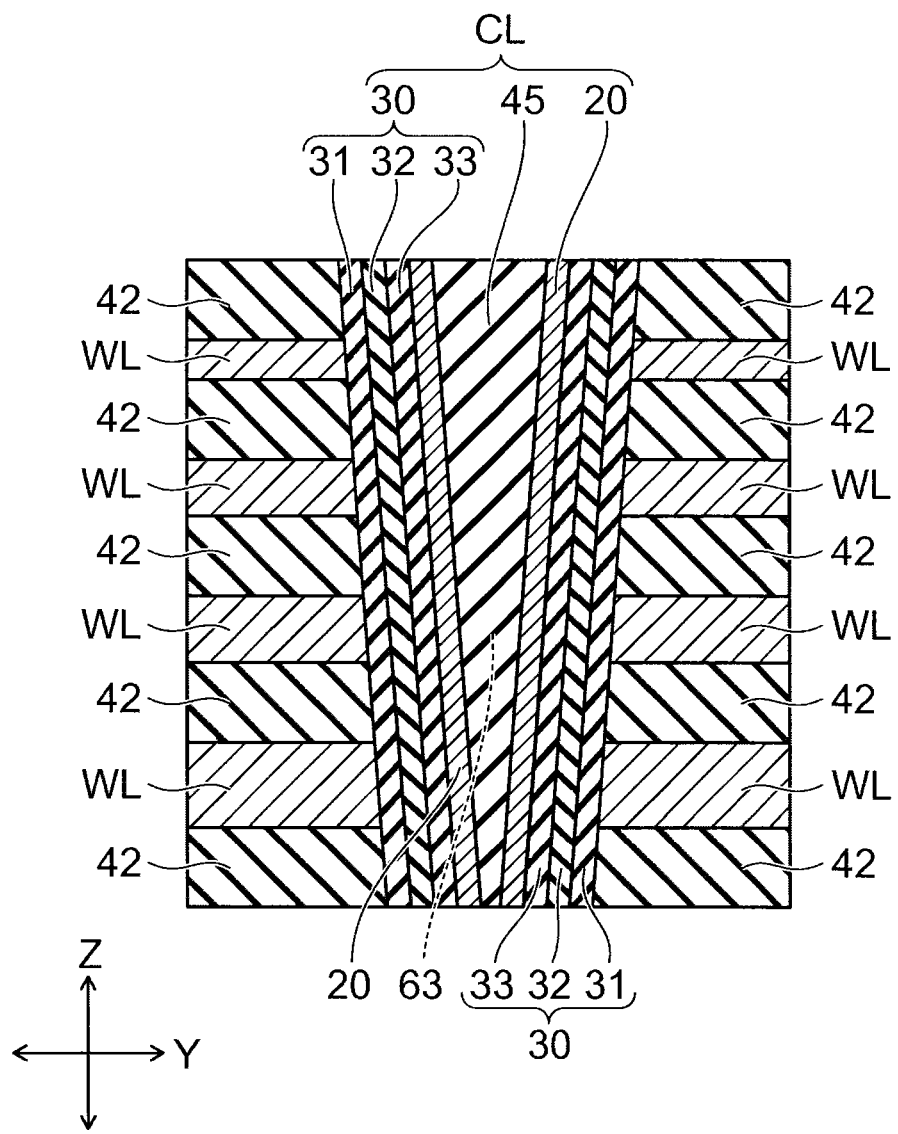
FIG. 3 is a schematic cross-sectional view of memory cells of the semiconductor memory device of the embodiment.

FIG. 3 is a schematic enlarged cross-sectional view of the memory cells of the embodiment.

The memory cell array 1 of the embodiment includes a stacked body in which the electrode layers WL and insulating layers 42 are multiply stacked alternately one layer at a time. The stacked body is provided on a back gate BG that is used as a lower gate layer. The number of layers of the electrode layers WL shown in the drawing is an example; and the number of layers of the electrode layers WL is arbitrary.

The back gate BG is provided on the substrate 10 with an insulating layer 40 interposed. The back gate BG and the electrode layer WL are conductive layers and are silicon layers to which, for example, an impurity is added.

The memory cell array 1 includes multiple memory strings MS. One memory string MS is formed in a U-shaped configuration to include a pair of columnar portions CL extending in the Z-direction and a linking portion JP that links the lower ends of the pair of columnar portions CL. The columnar portion CL is formed in, for example, a circular columnar configuration.

A drain-side selection gate SGD is provided at one upper end portion of the pair of columnar portions CL of the memory string MS having the U-shaped configuration; and a source-side selection gate SGS is provided at the other upper end portion. The drain-side selection gate SGD and the source-side selection gate SGS are provided as upper selection gates on the electrode layer WL of the uppermost layer with the insulating layer 42 interposed between the drain-side selection gate SGD and the electrode layer WL of the uppermost layer and between the source-side selection gate SGS and the electrode layer WL of the uppermost layer.

The drain-side selection gate SGD and the source-side selection gate SGS are silicon layers to which, for example, an impurity is added.

The drain-side selection gate SGD and the source-side selection gate SGS are separated in the Y-direction by an insulating separation film 62. The stacked body under the drain-side selection gate SGD and the stacked body under the source-side selection gate SGS also are separated in the Y-direction by the insulating separation film 62. In other words, the stacked body between the pair of columnar portions CL of the memory string MS is separated in the Y-direction by the insulating separation film 62.

A source line (e.g., a metal film) SL is provided on the source-side selection gate SGS with an insulating layer interposed. Multiple bit lines (e.g., metal films) BL are provided on the drain-side selection gate SGD and on the source line SL with an insulating layer interposed between the drain-side selection gate SGD and the bit lines BL and between the source line SL and the bit lines BL. Each of the bit lines BL extends in the Y-direction.

The memory string MS includes a channel body 20 provided inside a memory hole MH (shown in FIG. 7A) made in a U-shaped configuration in the stacked body that includes the back gate BG, the multiple electrode layers WL, and the multiple insulating layers 42. The channel body 20 is, for example, a silicon film. The impurity concentration of the channel body 20 is lower than the impurity concentration of the electrode layer WL.

The channel body 20 is provided inside the memory hole MH having the U-shaped configuration with a memory film 30 interposed. The memory film 30 is provided between the channel body 20 and the inner wall of the memory hole MH.

As shown in FIG. 3, the channel body 20 is provided in a tubular configuration; and the memory film 30 is provided in a tubular configuration around the outer circumferential surface of the channel body 20. The electrode layers WL are provided around the channel body 20 with the memory film 30 interposed. A core insulating film 45 is provided inside the channel body 20. The core insulating film 45 is, for example, a silicon nitride film.

The memory film 30 includes a blocking film 31, a charge storage film 32, and a tunneling film 33. The blocking film 31, the charge storage film 32, and the tunneling film 33 are provided in order from the electrode layer WL side between the channel body 20 and the electrode layers WL. The blocking film 31 contacts the electrode layers WL; the tunneling film 33 contacts the channel body 20; and the charge storage film 32 is provided between the blocking film 31 and the tunneling film 33.

The channel body 20 functions as a channel of memory cell transistors (hereinbelow, called simply the memory cells); the electrode layers WL function as control gates of the memory cells; and the charge storage film 32 functions as a data storage layer that stores the charge injected from the channel body 20. In other words, the memory cells are formed at the intersections between the channel body 20 and each of the electrode layers WL and have a structure in which the control gate is provided around the channel.

The semiconductor memory device of the embodiment is a nonvolatile semiconductor memory device that can freely and electrically erase/program data and retain the memory content even when the power supply is OFF.

The memory cell is, for example, a charge trap memory cell. The charge storage film 32 has many trap sites that trap the charge and is, for example, a silicon nitride film or a hafnium oxide film ($HfO_2$ film).

The tunneling film 33 is, for example, a silicon oxide film, a silicon nitride film, or a stacked film of a silicon oxide film and a silicon nitride film and is used as a potential barrier when the charge is injected from the channel body 20 into the charge storage film 32 or when the charge stored in the charge storage film 32 diffuses into the channel body 20.

The blocking film 31 is, for example, a silicon oxide film, a silicon nitride film, an aluminum oxide film ($Al_2O_3$ film), a hafnium oxide film ($HfO_2$ film), or a stacked film including at least one selected from a silicon oxide film, a silicon nitride film, an aluminum oxide film ($Al_2O_3$ film), and a hafnium oxide film ($HfO_2$ film); and the blocking film 31 prevents the charge stored in the charge storage film 32 from diffusing into the electrode layer WL.

As shown in FIG. 1, a drain-side selection transistor STD is provided at one upper end portion of the pair of columnar portions CL; and a source-side selection transistor STS is provided at the other upper end portion. Similarly to the memory cells, the drain-side selection transistor STD and the source-side selection transistor STS are vertical transistors.

The drain-side selection gate SGD functions as the gate electrode of the drain-side selection transistor STD. An insulating film (not shown) that functions as the gate insulating film of the drain-side selection transistor STD is provided between the drain-side selection gate SGD and the channel body 20. The channel body of the drain-side selection transistor STD is connected to the bit line BL above the drain-side selection gate SGD.

The source-side selection gate SGS functions as the gate electrode of the source-side selection transistor STS. An insulating film (not shown) that functions as the gate insulating film of the source-side selection transistor STS is provided between the source-side selection gate SGS and the channel body 20. The channel body of the source-side selection transistor STS is connected to the source line SL above the source-side selection gate SGS.

A back gate transistor BGT is provided in the linking portion JP of the memory string MS. The back gate BG functions as the gate electrode of the back gate transistor BGT. The memory film 30 that is provided inside the back gate BG functions as the gate insulating film of the back gate transistor BGT.

The multiple memory cells having the electrode layers WL of each layer as control gates are provided between the drain-side selection transistor STD and the back gate transistor BGT. Similarly, the multiple memory cells having the electrode layers WL of each layer as control gates are provided between the back gate transistor BGT and the source-side selection transistor STS.

The multiple memory cells, the drain-side selection transistor STD, the back gate transistor BGT, and the source-side selection transistor STS are connected in series via the channel body 20 and are included in one memory string MS having a U-shaped configuration. By the memory string MS being multiply arranged in the X-direction and the Y-direction, the multiple memory cells are provided three-dimensionally in the X-direction, the Y-direction, and the Z-direction.

The electrode layer WL is separated into a plurality in the first direction (the Y-direction). Each of the electrode layers WL that is separated in the first direction (the Y-direction) extends in the second direction (the X-direction). The second direction (the X-direction) intersects (e.g., is orthogonal to) the first direction (the Y-direction) in a plane parallel to the major surface of the substrate 10.

The multiple columnar portions CL of different memory strings MS are arranged in the X-direction to share one electrode layer WL extending in the X-direction.

As described below, the columnar portion CL that includes the memory film 30, the channel body 20, and the core insulating film 45 is formed inside a hole 63 shown in FIG. 6B. The diameter of the hole 63 is nonuniform in the depth direction. In other words, the hole 63 has a large diameter portion and a small diameter portion, where the diameter of the hole 63 is smaller at the small diameter portion than at the large diameter portion.

Figure 6A:
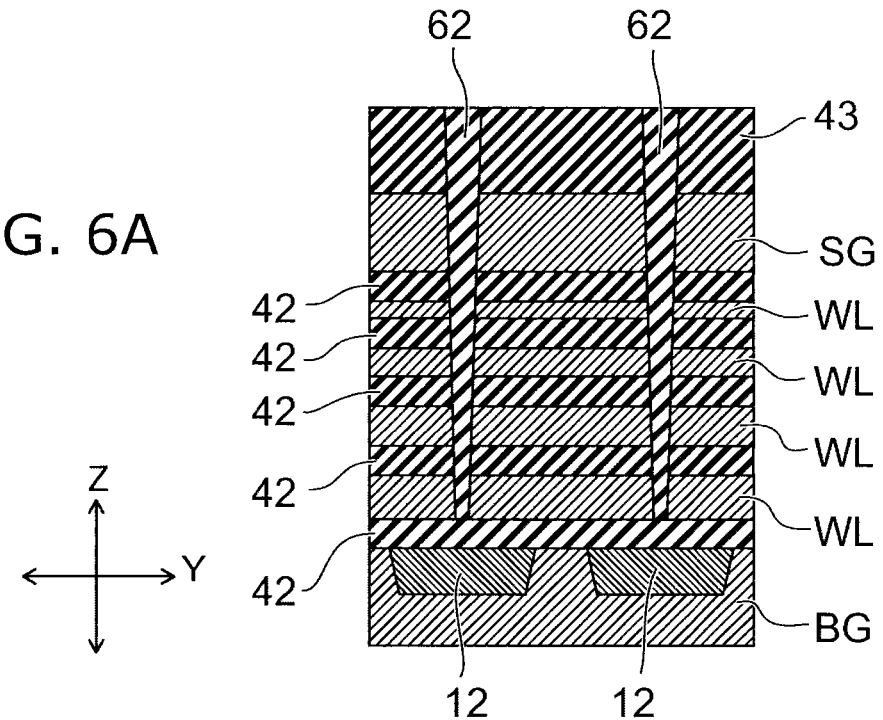
Figure 6B:
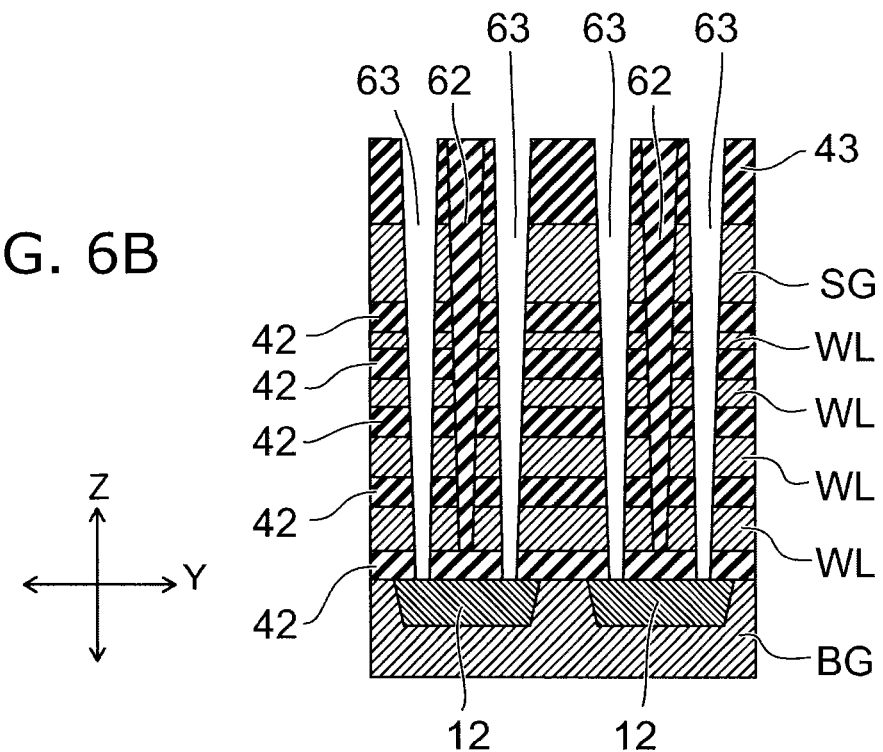

According to the embodiment shown in FIG. 6B, the diameter of the hole 63 gradually decreases from the upper portion on the opening end side toward the lower portion on the substrate side. In other words, the diameter of the hole 63 is smaller at the lower portion than at the upper portion.

Accordingly, the columnar portion CL filled into the hole 63 becomes finer gradually from the upper portion toward the lower portion as shown in FIGS. 2 and 3. In other words, the lower portion of the columnar portion CL is finer than the upper portion of the columnar portion CL.

The diameter of the hole 63 may decrease in stages from the upper portion toward the lower portion. The columnar portion CL may become finer in stages from the upper portion toward the lower portion.

According to the embodiment, the thickness of the electrode layer WL adjacent to the small diameter portion of the hole 63 (the columnar portion CL) is thicker than the thickness of the electrode layer WL adjacent to the large diameter portion of the hole 63 (the columnar portion CL). In other words, the electrode layers WL on the lower layer side are thicker than the electrode layers WL on the upper layer side. In the least, the electrode layer WL of the lowermost layer is thicker than the electrode layer WL of the uppermost layer.

The gate lengths of the electrode layers WL on the lower layer side are longer than the gate lengths of the electrode layers WL on the upper layer side. Herein, the gate length is the length of the surface of the electrode layer WL contacting the memory film 30 in the channel length direction. In the least, the gate length of the electrode layer WL of the lowermost layer is longer than the gate length of the electrode layer WL of the uppermost layer.

In a process in the current state of the art, it is difficult to pattern the hole to have a uniform diameter in the depth direction particularly in the case where the aspect ratio is high. The hole 63 shown in FIG. 6B is made by anisotropic etching such as RIE (Reactive Ion Etching), etc.

In RIE, an etching gas is introduced to a chamber; plasma is generated inside the chamber; etching ions are accelerated toward the substrate side by applying a potential to the substrate; and anisotropic etching is performed by the impact of the ions. Also, in RIE, etching in the diametrical direction is suppressed because the reaction products protect the side surfaces of the holes that are etched. There are cases where the diameter decreases as the etching progresses in the depth direction due to the side surface protection of the reaction products.

In the case where the diameter of the hole changes in the depth direction, the threshold voltage of the memory cell transistor (also called simply the memory cell) having the electrode layer WL as a control gate is different between the upper and lower memory cells.

Figure 12:
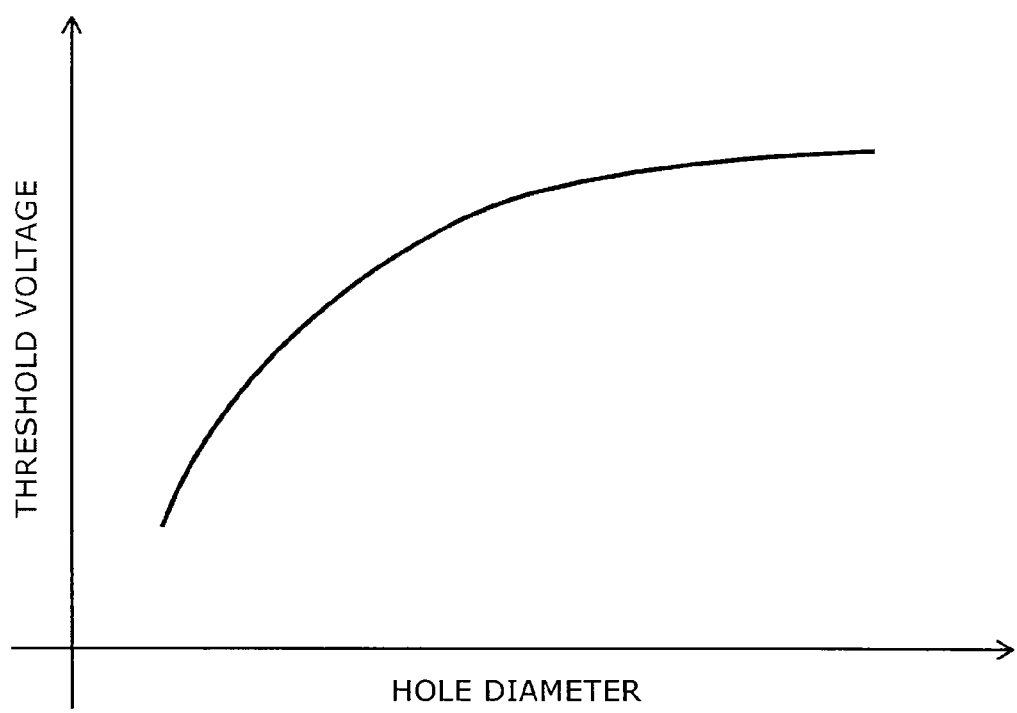
FIG. 12 is a graph showing the relationship between the threshold voltage and the diameter of the hole.

FIG. 12 shows the hole diameter dependence characteristics of the threshold voltage of the memory cell. The horizontal axis is the diameter of the hole; and the vertical axis is the threshold voltage of the memory cell. Here, the threshold voltage is a neutral threshold voltage.

As shown in FIG. 12, the threshold voltage of the memory cell decreases as the diameter of the hole decreases. In other words, in the example shown in FIGS. 1 to 3, the threshold voltage of the memory cell decreases toward the lower layer side. The fluctuation of the neutral threshold voltage may cause fluctuation of the threshold voltage after the programming/erasing and may cause fluctuation of the programming/erasing speed.

Therefore, according to the embodiment, the thickness of the electrode layer WL is changed according to the change of the diameter of the hole 63 (the diameter of the columnar portion CL).

The thickness of the electrode layer WL adjacent to the portion of the hole 63 where the diameter is small (the portion where the columnar portion CL is fine) is set to be thicker than the thickness of the electrode layer WL adjacent to the portion of the hole 63 where the diameter is large (the portion where the diameter of the columnar portion CL is large).

In other words, the gate length is longer for the portion of the hole 63 where the diameter is small (the portion where the columnar portion CL is fine) which is the portion where the threshold voltage is low; and the decrease of the threshold voltage can be suppressed. Accordingly, the fluctuation of the neutral threshold voltage of the memory cells in the depth direction of the hole 63 (the stacking direction of the memory cells) can be suppressed.

As a result, it is possible to suppress the fluctuation of the threshold voltage after the programming/erasing and the fluctuation of the programming/erasing speed between the memory cells stacked in the Z-direction.

Figure 11A:
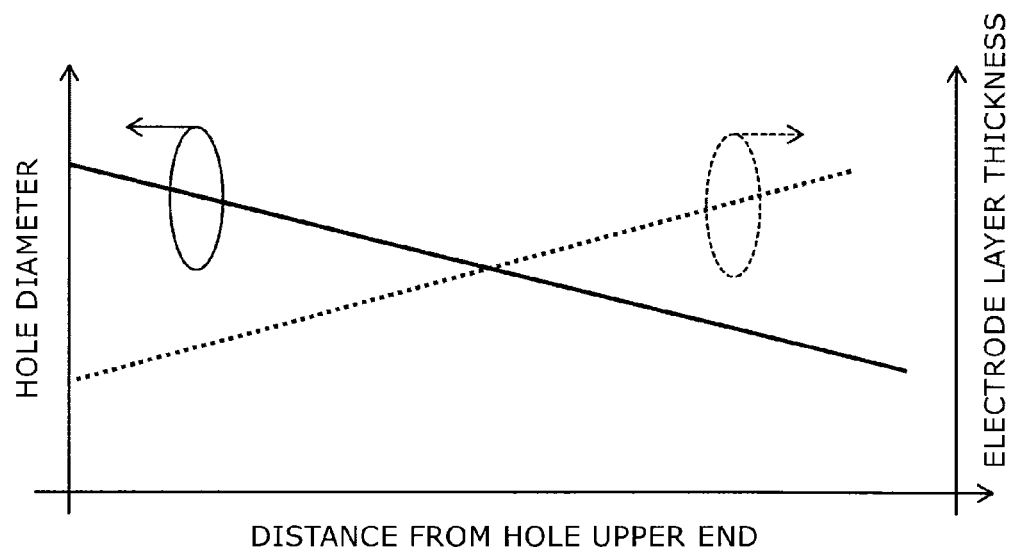
FIGS. 11A and 11B are schematic views showing examples of relationships between the change of the diameter of the hole and the change of the thickness for the electrode layers in the semiconductor memory device of the embodiment.
Figure 11B:
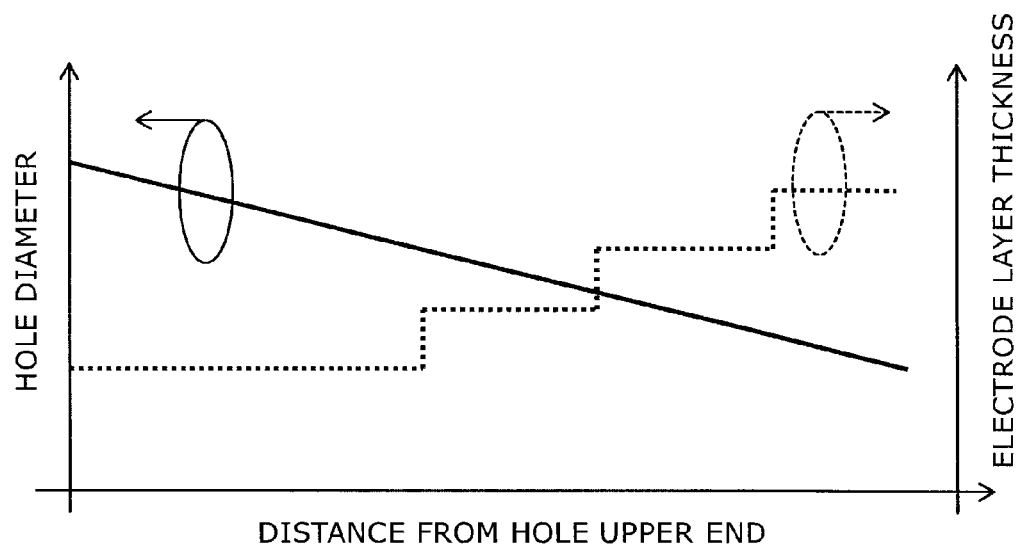

FIGS. 11A and 11B are schematic views showing an example of the relationship between the change of the diameter of the hole 63 (the solid line) and the change of the thickness of the electrode layer WL (the broken line).

The horizontal axis is the distance from the hole upper end (in the depth direction of the hole 63). The vertical axis on the left side is the diameter of the hole 63. The vertical axis on the right side is the thickness (the gate length) of the electrode layer WL.

According to FIG. 11A, the thickness is changed one layer at a time for the multiple electrode layers WL as the diameter of the hole 63 changes.

According to FIG. 11B, the thickness is changed in stages of multiple layers of the multiple electrode layers WL as the diameter of the hole 63 changes.

A method for forming the memory cell array 1 of the embodiment will now be described with reference to FIG. 4A to FIG. 7B.

Figure 4A:
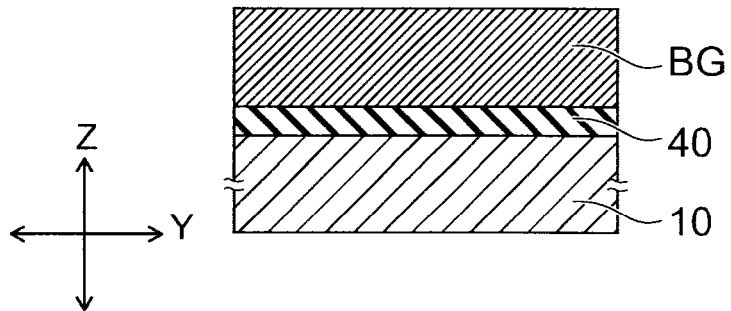
FIG. 4A to FIG. 7B are schematic cross-sectional views showing a method for manufacturing the semiconductor memory device of the embodiment.

As shown in FIG. 4A, the back gate BG is formed on the substrate 10 with the insulating layer 40 interposed. The substrate 10 and the insulating layer 40 are not shown in FIG. 4B and subsequent drawings.

Figure 4B:
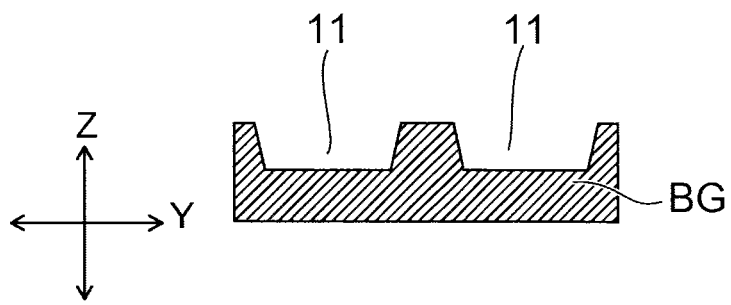

As shown in FIG. 4B, multiple recesses 11 are made in the back gate BG by etching using a not-shown mask.

Figure 4C:
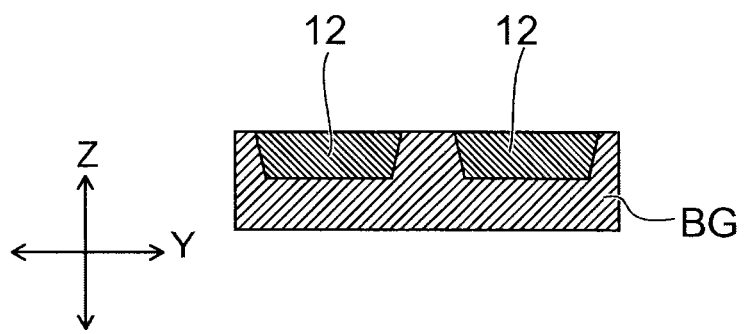

As shown in FIG. 4C, a sacrificial film 12 is filled into the recesses 11. The sacrificial film 12 is, for example, a silicon nitride film.

Figure 5A:
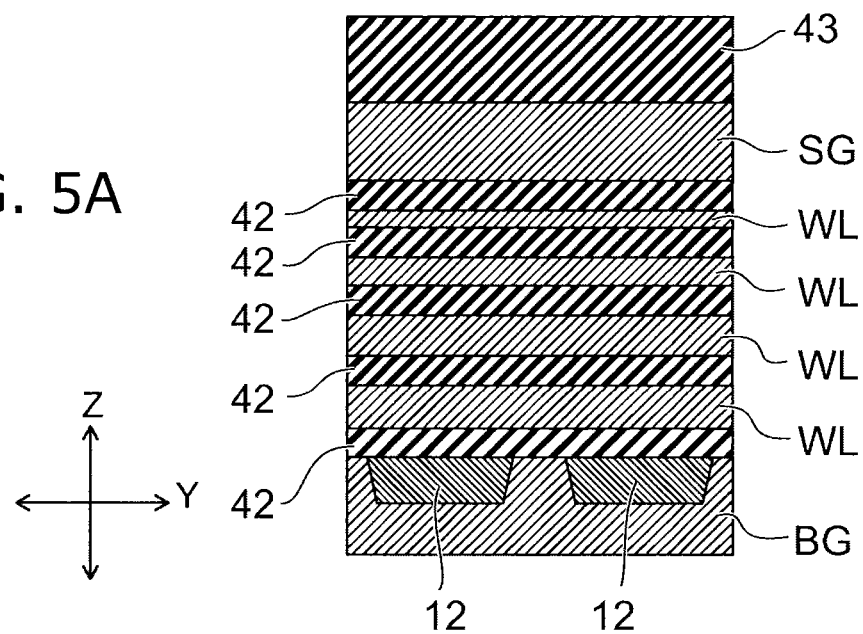

A protrusion upper surface of the back gate BG is exposed between the recesses 11. The protrusion upper surface of the back gate BG and the upper surface of the sacrificial film 12 are planarized; and the insulating layers 42 and the electrode layers WL are multiply stacked alternately with each other on the flat surface as shown in FIG. 5A.

At this time, the electrode layers WL on the lower layer side are formed to be thicker than the electrode layers WL on the upper layer side. In the least, the electrode layer WL of the lowermost layer is set to be thicker than the electrode layer WL of the uppermost layer.

An upper selection gate SG that is used to form the drain-side selection gate SGD or the source-side selection gate SGS is formed on the electrode layer WL of the uppermost layer with the insulating layer 42 interposed; and an insulating layer 43 is formed on the upper selection gate SG.

The stacked body that includes the back gate BG, the insulating layers 42, the electrode layers WL, the upper selection gate SG, and the insulating layer 43 is formed by, for example, CVD (chemical vapor deposition).

The back gate BG, the electrode layers WL, and the upper selection gate SG are, for example, silicon layers to which boron is added as an impurity. The insulating layers 42 and 43 are, for example, silicon oxide layers.

Figure 5B:
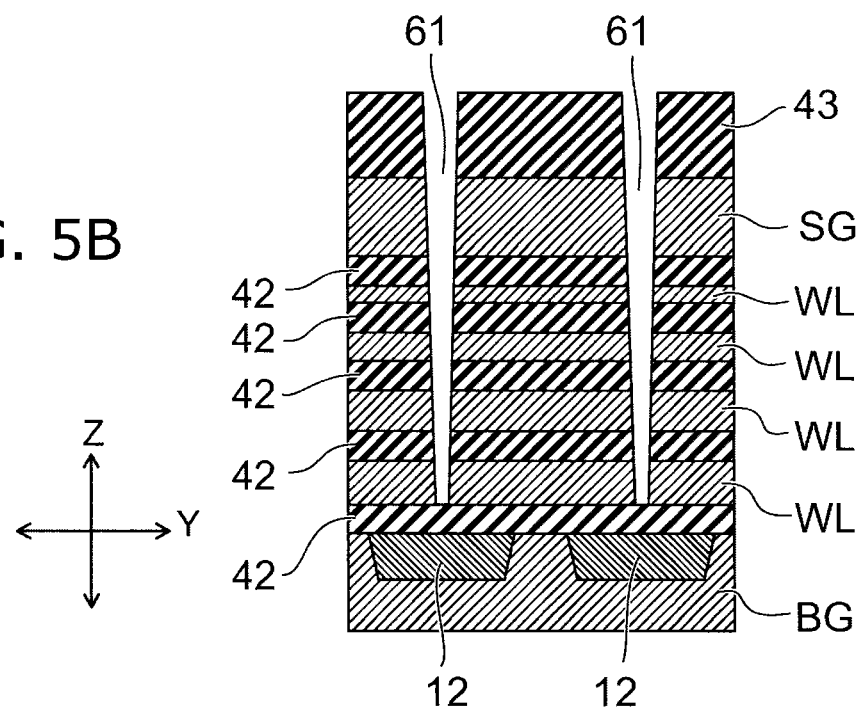

After forming the stacked body shown in FIG. 5A, multiple slits 61 are made in the stacked body to reach the insulating layer 42 of the lowermost layer by photolithography and etching as shown in FIG. 5B. The slits 61 are made above the sacrificial film 12 to separate the stacked body in the Y-direction.

As shown in FIG. 6A, the insulating separation film 62 is filled into the slits 61. The insulating separation film 62 is, for example, a silicon nitride film.

After forming the insulating separation film 62, the multiple holes 63 are made in the stacked body recited above as shown in FIG. 6B. The holes 63 are made by, for example, RIE (reactive ion etching) using a not-shown mask.

The side wall of the hole 63 is a tapered surface that is tilted to be not perpendicular to the substrate major surface; and the diameter of the hole 63 is smaller at the lower portion than at the upper portion.

The bottom of the hole 63 reaches the sacrificial film 12; and the sacrificial film 12 is exposed at the bottom of the hole 63. One pair of holes 63 is made on one sacrificial film 12.

After making the holes 63, the sacrificial film 12 is removed by etching via the holes 63. The sacrificial film 12 is removed by, for example, wet etching.

Figure 7A:
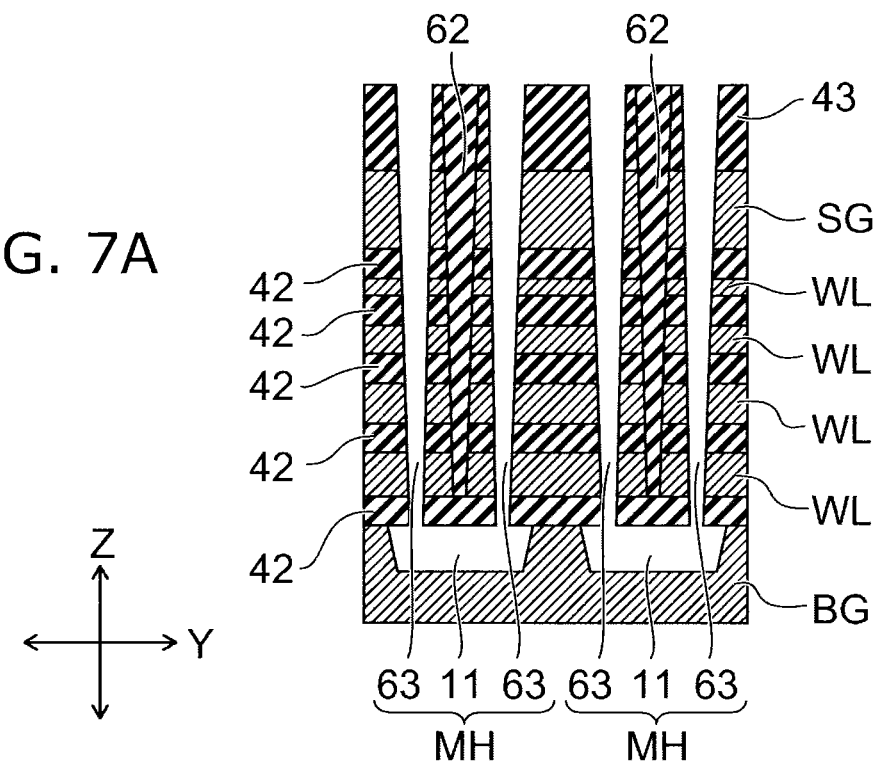

By the removal of the sacrificial film 12, the recesses 11 made in the back gate BG appear as shown in FIG. 7A. One pair of holes 63 communicates with one recess 11. In other words, the lower ends of the pair of holes 63 communicate with one common recess 11 to make one memory hole MH having a U-shaped configuration.

Figure 7B:
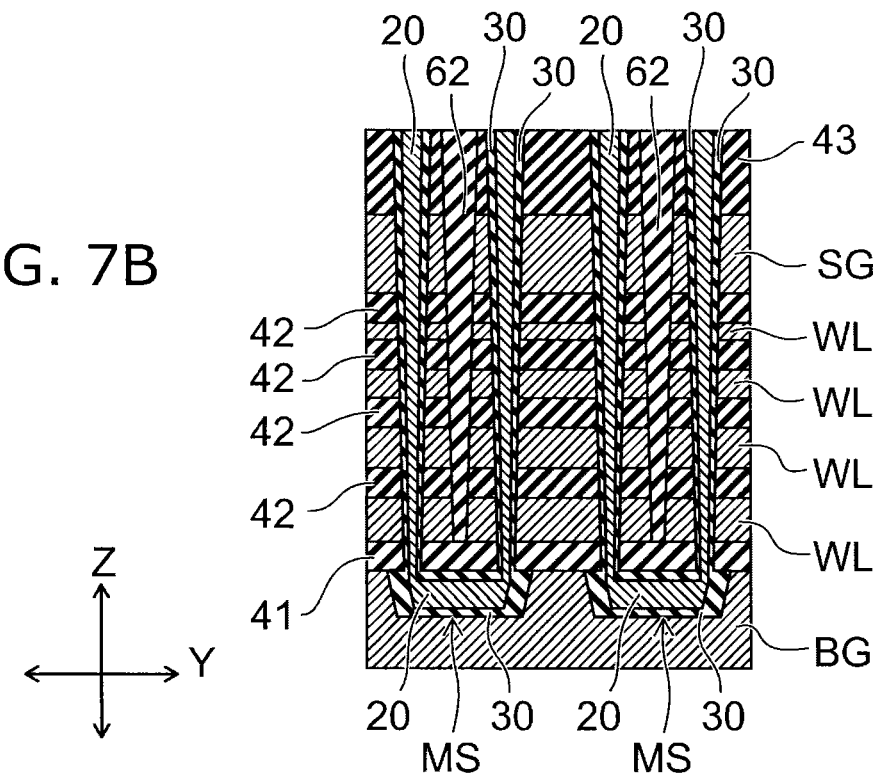

As shown in FIG. 7B, the memory film 30 is formed on the inner wall of the memory hole MH. The channel body 20 is formed on the inner wall of the memory film 30 inside the memory hole MH. As shown in FIG. 3, the core insulating film 45 is formed inside the channel body 20 that is inside the memory hole MH.

The upper selection gate SG that is between the memory strings MS adjacent to each other in the Y-direction is separated in the Y-direction by an insulating separation film 66 as shown in FIG. 2.

Subsequently, the source lines SL, the bit lines BL, etc., shown in FIG. 1 are formed on the insulating layer 43.

Figure 8:
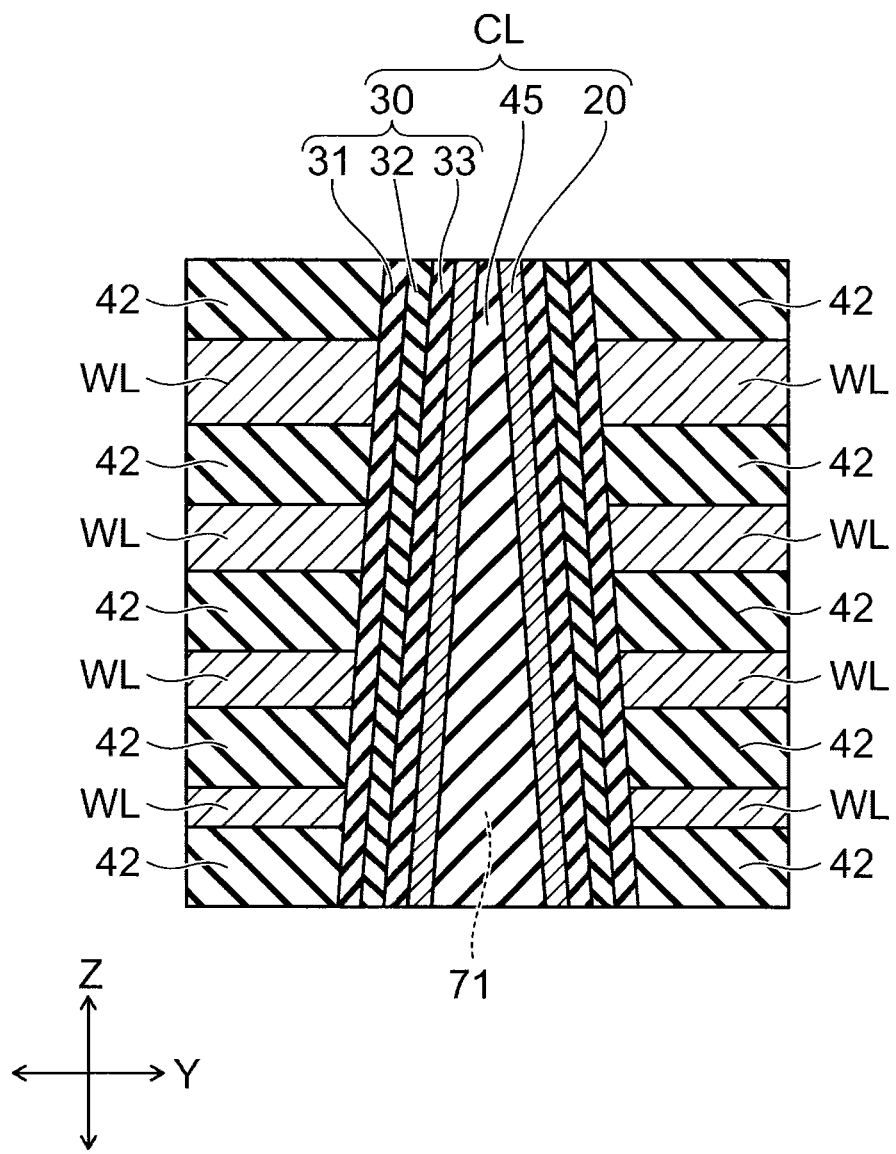
FIG. 8 is a schematic view of memory cells of the semiconductor memory device of the embodiment.

FIG. 8 is a schematic enlarged cross-sectional view of memory cells of another embodiment.

As shown in FIG. 8, there are cases where the diameter of a hole 71 increases gradually from the upper portion toward the lower portion due to the etching conditions. In other words, the diameter of the hole 71 is larger at the lower portion of the hole 71 than at the upper portion of the hole 71.

Accordingly, the diameter of the columnar portion CL filled into the hole 71 increases gradually from the upper portion toward the lower portion. In other words, the lower portion of the columnar portion CL is thicker than the upper portion of the columnar portion CL.

The diameter of the hole 71 may increase in stages from the upper portion toward the lower portion. Also, the columnar portion CL may increase in stages from the upper portion toward the lower portion.

According to the embodiment shown in FIG. 8, the thickness of the electrode layer WL adjacent to the small diameter portion of the hole 71 (the columnar portion CL) is thicker than the thickness of the electrode layer WL adjacent to the large diameter portion of the hole 71 (the columnar portion CL). In other words, the electrode layers WL on the upper layer side are thicker than the electrode layers WL on the lower layer side. In the least, the electrode layer WL of the uppermost layer is thicker than the electrode layer WL of the lowermost layer.

Also, the gate lengths of the electrode layers WL on the upper layer side are longer than the gate lengths of the electrode layers WL on the lower layer side. In the least, the gate length of the electrode layer WL of the uppermost layer is longer than the gate length of the electrode layer WL of the lowermost layer.

According to the embodiment, the thickness of the electrode layer WL adjacent to the portion of the hole 71 where the diameter is small (the portion where the columnar portion CL is fine) is set to be thicker than the thickness of the electrode layer WL adjacent to the portion of the hole 71 where the diameter is large (the portion where the diameter of the columnar portion CL is large).

In other words, the gate length is longer for the portion of hole 71 where the diameter is small (the portion where the columnar portion CL is fine) which is the portion where the threshold voltage is low; and the decrease of the threshold voltage can be suppressed. Accordingly, the fluctuation of the neutral threshold voltage of the memory cells in the depth direction of the hole 71 (the stacking direction of the memory cells) can be suppressed.

As a result, it is possible to suppress the fluctuation of the threshold voltage after the programming/erasing and the fluctuation of the programming/erasing speed between the memory cells stacked in the Z-direction.

As the diameter of the hole 71 changes, the thickness may be changed one layer at a time for the multiple electrode layers WL; or the thickness may be changed in stages of multiple layers of the multiple electrode layers WL.

Figure 9A:
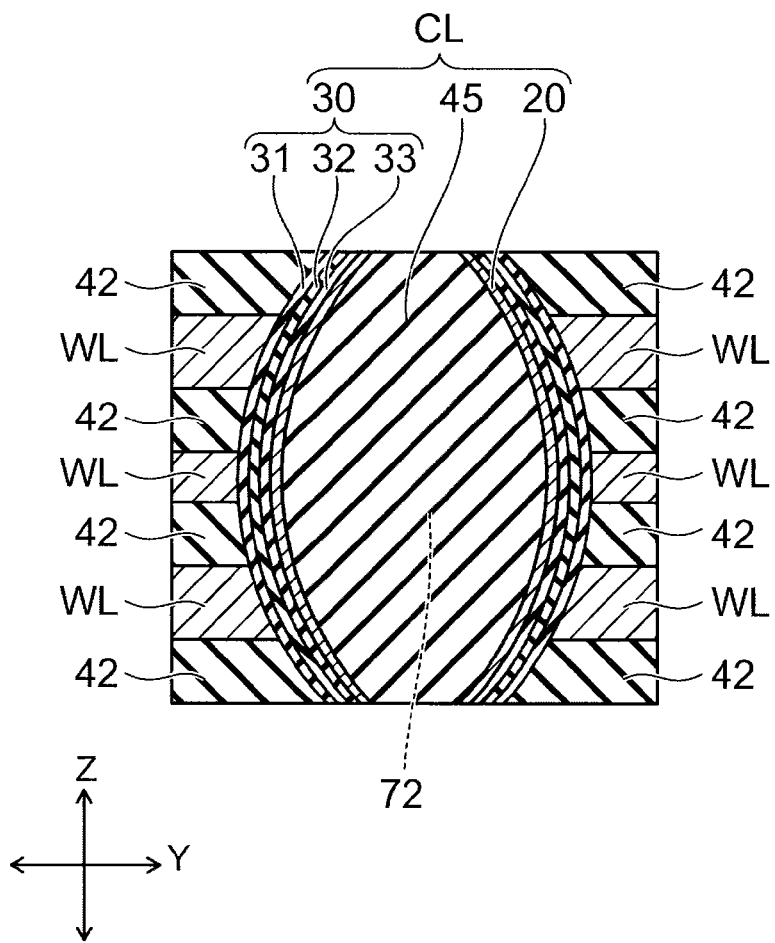
FIGS. 9A and 9B are schematic views of memory cells of the semiconductor memory device of the embodiment.

FIG. 9A is a schematic enlarged cross-sectional view of memory cells of another embodiment.

Figure 9B:
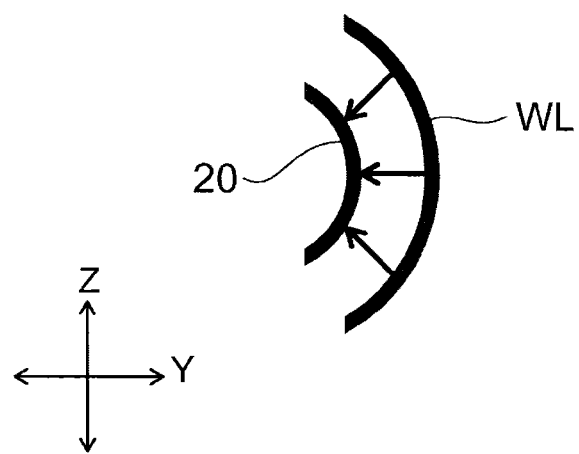

FIG. 9B is a schematic view showing the channel body 20 and a portion of the electrode layers WL contacting the memory film 30 in a region of a hole 72 on the right side of the central axis of FIG. 9A.

As shown in FIG. 9A, there are cases where the diameters of the hole 72 at the upper portion and the lower portion are smaller than the diameter at a central portion between the upper portion and the lower portion due to the etching conditions. Accordingly, the columnar portion CL that is filled into the hole 72 is formed in a barrel-like configuration; and the upper portion and lower portion of the columnar portion CL are finer than the central portion between the upper portion and the lower portion.

Further, according to the embodiment shown in FIG. 9A, the thicknesses of the electrode layers WL adjacent to the small diameter portions (the upper portion and the lower portion) of the hole 72 (the columnar portion CL) are thicker than the thickness of the electrode layer WL adjacent to the large diameter portion (the central portion) of the hole 72 (the columnar portion CL).

The gate lengths of the electrode layers WL on the upper layer side and lower layer side are longer than the gate length of the electrode layer WL at the central portion.

According to the embodiment, the thickness of the electrode layer WL adjacent to the portion of the hole 72 where the diameter is small (the portion where the columnar portion CL is fine) is set to be thicker than the thickness of the electrode layer WL adjacent to the portion of the hole 72 where the diameter is large (the portion where the diameter of the columnar portion CL is large).

In other words, the gate length is longer for the portion of the hole 72 where the diameter is small (the portion where the columnar portion CL is fine) which is the portion where the threshold voltage is low; and the decrease of the threshold voltage can be suppressed. Accordingly, the fluctuation of the neutral threshold voltage of the memory cells in the depth direction of the hole 72 (the stacking direction of the memory cells) can be suppressed.

As a result, it is possible to suppress the fluctuation of the threshold voltage after the programming/erasing and the fluctuation of the programming/erasing speed between the memory cells stacked in the Z-direction.

As the diameter of the hole 72 changes, the thickness may be changed one layer at a time for the multiple electrode layers WL; or the thickness may be changed in stages of multiple layers of the multiple electrode layers WL.

The side wall of the hole 72 and the side wall of the columnar portion CL may not be linear and may have curvature in the cross section shown in FIG. 9A along the stacking direction (the Z-direction) of the stacked body. In the cross section, the channel body 20 and the interface between the electrode layer WL and the memory film 30 have curvature as shown in FIG. 9B.

When programming the data, the potentials of the electrode layers WL are set to be higher than the potential of the channel body 20. The lines of electric force in the programming are schematically illustrated by the arrows in FIG. 9B.

Because the channel length direction (the gate length direction) is not parallel to the Z-direction and is curved, the electric field concentrates in the channel body 20; and it is possible to increase the programming efficiency (reduce the programming voltage).

Figure 10A:
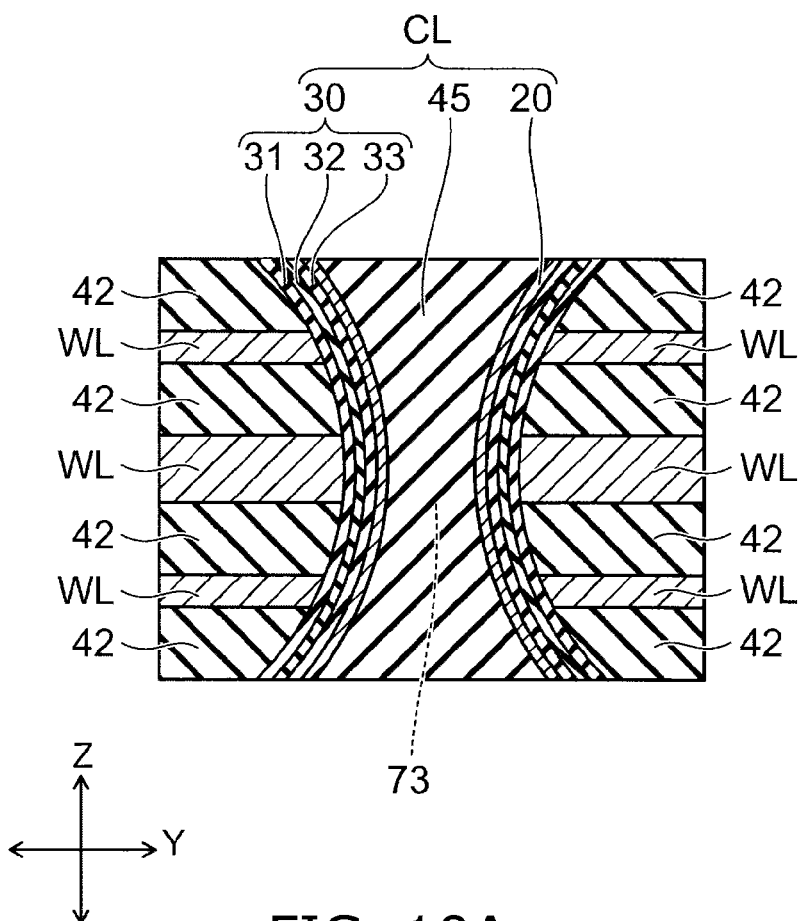
FIGS. 10A and 10B are schematic views of memory cells of the semiconductor memory device of the embodiment.

FIG. 10A is a schematic enlarged cross-sectional view of memory cells of another embodiment.

Figure 10B:
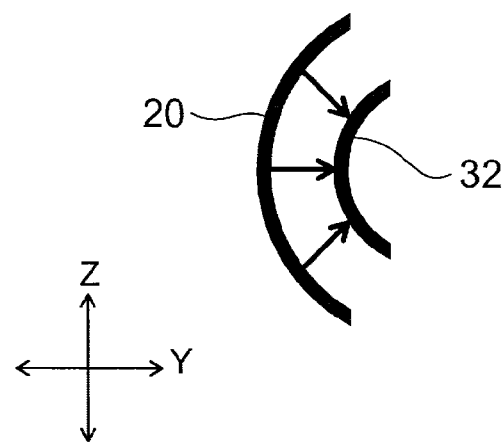

FIG. 10B is a schematic view showing the channel body 20 and the charge storage film 32 in a region of a hole 73 on the right side of the central axis of FIG. 10A.

There are cases where the diameters of the hole 73 at the upper portion and the lower portion are larger than the diameter at the central portion between the upper portion and the lower portion as shown in FIG. 10A due to the etching conditions. Accordingly, the diameters of the upper portion and lower portion of the columnar portion CL filled into the hole 73 are larger than that of the central portion between the upper portion and the lower portion.

Also, according to the embodiment shown in FIG. 10A, the thicknesses of the electrode layers WL adjacent to the large diameter portions (the upper portion and the lower portion) of the hole 73 (the columnar portion CL) are thinner than the thickness of the electrode layer WL adjacent to the small diameter portion (the central portion) of the hole 73 (the columnar portion CL).

The gate length of the electrode layer WL at the central portion is longer than the gate lengths of the electrode layers WL on the upper layer side and lower layer side.

According to the embodiment, the thickness of the electrode layer WL adjacent to the portion of the hole 73 where the diameter is small (the portion where the columnar portion CL is fine) is set to be thicker than the thickness of the electrode layer WL adjacent to the portion of the hole 73 where the diameter is large (the portion where the diameter of the columnar portion CL is large).

In other words, the gate length is longer for the portion of the hole 73 where the diameter is small (the portion where the columnar portion CL is fine) which is the portion where the threshold voltage is low; and the decrease of the threshold voltage can be suppressed. Accordingly, the fluctuation of the neutral threshold voltage of the memory cells in the depth direction of the hole 73 (the stacking direction of the memory cells) can be suppressed.

As a result, it is possible to suppress the fluctuation of the threshold voltage after the programming/erasing and the fluctuation of the programming/erasing speed between the memory cells stacked in the Z-direction.

As the diameter of the hole 73 changes, the thickness may be changed one layer at a time for the multiple electrode layers WL; or the thickness may be changed in stages of multiple layers of the multiple electrode layers WL.

The side wall of the hole 73 and the side wall of the columnar portion CL may not be linear and may have curvature in the cross section shown in FIG. 10A along the stacking direction (the Z-direction) of the stacked body. In the cross section, as shown in FIG. 10B, the channel body 20 and the charge storage film 32 have curvature.

When erasing the data, the potential of the channel body 20 is set to be higher than the potentials of the electrode layers WL. The lines of electric force in the erasing are schematically illustrated by the arrows in FIG. 10B.

Because the channel length direction (the gate length direction) is not parallel to the Z-direction and is curved, the electric field concentrates in the charge storage film 32; and it is possible to increase the erasing efficiency (reduce the erasing voltage).

The embodiments described above illustrate the memory string MS having the U-shaped configuration in which the lower ends of a pair of columnar portions CL are linked to each other inside the back gate BG which is the lower gate layer. However, the memory string may have a straight structure having an I-shaped configuration that pierces the lower gate layer (the lower selection gate), pierces the stacked body including the multiple electrode layers stacked on the lower gate layer, and pierces the upper gate layer (the upper selection gate) provided on the stacked body.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
   a substrate;
   a stacked body including a plurality of electrode layers stacked alternately with a plurality of insulating layers on the substrate;
   a channel body provided inside a hole piercing the stacked body, the channel body extending in a stacking direction of the stacked body; and
   a memory portion provided between the channel body and each of the plurality of electrode layers;
   the hole having a large diameter portion and a small diameter portion, the diameter of the hole being smaller at the small diameter portion than at the large diameter portion,
   a thickness of the electrode layer adjacent to the small diameter portion being thicker than a thickness of the electrode layer adjacent to the large diameter portion.

2. The device according to claim 1, wherein
   a diameter of the hole is smaller at a lower portion of the hole than at an upper portion of the hole, and
   the electrode layer on a lower layer side is thicker than the electrode layer on an upper layer side.

3. The device according to claim 2, wherein a gate length of the electrode layer on the lower layer side is longer than a gate length of the electrode layer on the upper layer side.

4. The device according to claim 2, wherein thicknesses of the electrode layers change in stages.

5. The device according to claim 1, wherein
a diameter of the hole is smaller at an upper portion of the hole than at a lower portion of the hole, and
the electrode layer on an upper layer side is thicker than the electrode layer on a lower layer side.

6. The device according to claim 5, wherein a gate length of the electrode layer on the upper layer side is longer than a gate length of the electrode layer on the lower layer side.

7. The device according to claim 5, wherein thicknesses of the electrode layers change in stages.

8. The device according to claim 1, wherein a side wall of the hole has curvature in a cross section along the stacking direction of the stacked body.

9. The device according to claim 1, wherein a diameter of the hole is smaller at an upper portion of the hole and at a lower portion of the hole than at a central portion of the hole between the upper portion and the lower portion.

10. The device according to claim 9, wherein an interface between the electrode layer and the memory portion has curvature in a cross section along the stacking direction of the stacked body, and the channel body has curvature in the cross section along the stacking direction of the stacked body.

11. The device according to claim 1, wherein a diameter of the hole is larger at an upper portion of the hole and at a lower portion of the hole than at a central portion of the hole between the upper portion and the lower portion.

12. The device according to claim 11, wherein the channel body has curvature in a cross section along the stacking direction of the stacked body, and the memory portion has curvature in the cross section along the stacking direction of the stacked body.

13. The device according to claim 1, wherein the channel body includes:
a pair of columnar portions piercing the stacked body; and
a linking portion linking lower ends of the pair of columnar portions.

14. The device according to claim 13, wherein a lower portion of the columnar portion is finer than an upper portion of the columnar portion.

15. The device according to claim 13, wherein a lower portion of the columnar portion is thicker than an upper portion of the columnar portion.

16. The device according to claim 13, wherein an upper portion of the columnar portion and a lower portion of the columnar portion are finer than a central portion of the columnar portion between the upper portion and the lower portion.

17. The device according to claim 13, wherein an upper portion of the columnar portion and a lower portion of the columnar portion are thicker than a central portion of the columnar portion between the upper portion and the lower portion.

18. The device according to claim 13, wherein a side wall of the columnar portion has curvature in a cross section along the stacking direction of the stacked body.

19. The device according to claim 1, wherein
the memory portion and the channel body are provided in tubular configurations, and
the electrode layers are provided around the channel body with the memory portion interposed.

20. The device according to claim 1, further comprising an upper selection gate provided on the stacked body.

* * * * *